US012738321B2

(12) United States Patent
Cui et al.

(10) Patent No.: US 12,738,321 B2
(45) Date of Patent: Sep. 15, 2026

(54) METHODS TO REDUCE VPASS DISTURB IN 3D NAND MEMORY

(71) Applicant: Yangtze Memory Technologies Co., Ltd., Wuhan (CN)

(72) Inventors: Ying Cui, Wuhan (CN); Songmin Jiang, Wuhan (CN); Yali Song, Wuhan (CN); Hongtao Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 159 days.

(21) Appl. No.: 18/471,916

(22) Filed: Sep. 21, 2023

(65) Prior Publication Data

US 2025/0046376 A1 Feb. 6, 2025

(30) Foreign Application Priority Data

Aug. 2, 2023 (CN) ......................... 202310974640.1

(51) Int. Cl.

*G11C 16/10* (2006.01)
*G11C 16/04* (2006.01)
*G11C 16/08* (2006.01)
*G11C 16/16* (2006.01)

(52) U.S. Cl.

CPC ........ *G11C 16/102* (2013.01); *G11C 16/0433* (2013.01); *G11C 16/08* (2013.01); *G11C 16/16* (2013.01)

(58) Field of Classification Search

CPC ... G11C 16/102; G11C 16/0433; G11C 16/08; G11C 16/16; G11C 16/0483; G11C 16/10; G11C 16/24; G11C 16/34

See application file for complete search history.

(56) References Cited

U.S. PATENT DOCUMENTS

2007/0047314 A1* 3/2007 Goda ................. G11C 16/0483 365/185.18
2007/0258276 A1* 11/2007 Higashitani ........ G11C 16/0483 365/10
2016/0148691 A1* 5/2016 Rabkin ............. G11C 16/0483 365/185.19
2018/0268907 A1* 9/2018 Shim .................. G11C 16/3459
2021/0020256 A1* 1/2021 Kim ....................... G11C 16/26
2021/0304810 A1* 9/2021 Lee ..................... G11C 11/4085
2023/0069260 A1* 3/2023 Lien ....................... G11C 16/10

* cited by examiner

*Primary Examiner* — Alexander Sofocleous
*Assistant Examiner* — James S Wells
(74) *Attorney, Agent, or Firm* — Conley Rose, P.C.

(57) ABSTRACT

The present disclosure provides a three-dimensional NAND memory device, comprising a memory array comprising blocks, each block includes first memory cells and second memory cells connected in series to a bit line, a word line driver, and a controller configured to control the word line driver to: performing a programming operation on a memory cell in the first memory cells, the memory cell is controlled by a selected word line of first word lines corresponding to the first memory cells, the first word lines comprising first unselected word lines adjacent to the selected word line, and the performing the programming operation comprises: applying a programming voltage signal to the selected word line to program the memory cell into a target state; applying a first pass voltage to the first unselected word lines; and applying a second pass voltage to second word lines corresponding to the second memory cells.

20 Claims, 9 Drawing Sheets

800

900

METHODS TO REDUCE VPASS DISTURB IN 3D NAND MEMORY

INCORPORATED BY REFERENCE

This application claims priority to Chinese Patent Application No. 202310974640.1, filed on Aug. 2, 2023, which is incorporated herein by reference in its entirety.

TECHNICAL FIELD

This description relates to a memory device and a method for programming operations. Specifically, the memory device and the method reduce inadvertent soft-programing of adjacent memory cells during programming operations.

BACKGROUND

Currently, the demand for a higher storage capacity of a memory device continues to increase. To meet the demand for a higher storage capacity, the number of storage layers and the number of unit storage bits of the memory device may continue to increase. A memory device can include a memory array comprising blocks. Each block can include one or more memory cells, and the memory device may perform an erasing operation based on a block-by-block basis.

BRIEF SUMMARY

Some aspects of this disclosure relate to memory devices and methods for programming operations. For example, the memory devices and the methods are provided for reducing Vpass disturb during programming operations.

Some aspects of this disclosure relate to a method for programming a memory device having a memory array comprising blocks. Each block includes first memory cells and second memory cells. The first memory cells and the second memory cells are connected in series to a bit line. The method includes performing a programming operation on a memory cell in the first memory cells. The memory cell is controlled by a selected word line of first word lines corresponding to the first memory cells. The first word lines comprises first unselected word lines adjacent to the selected word line. The performing the programming operation includes applying a programming voltage signal to the selected word line to program the memory cell into a target state. The performing the programming operation further includes applying a first pass voltage to the first unselected word lines. The performing the programming operation further includes applying a second pass voltage to second word lines corresponding to the second memory cells.

According to some aspects, the second pass voltage can be lower than the first pass voltage.

According to some aspects, the performing the programming operation can be subsequent to performing an erase operation on the first group of the memory cells.

According to some aspects, the first unselected word lines can be adjacent to the second word lines.

According to some aspects, the second pass voltage can be adjusted based on a position of the selected word line.

According to some aspects, the position of the selected word line can be determined by a number of the first unselected word lines between the selected word line and the second word lines.

According to some aspects, the second pass voltage can be adjusted to a third pass voltage when a first number of the first unselected word lines are between the selected word line and the second word lines. The second pass voltage can be adjusted to a fourth pass voltage different from the third pass voltage when a second number of the first unselected word lines are between the selected word line and the second word lines. The second number can be different from the first number.

According to some aspects, the second number can be smaller than the first number. And the fourth pass voltage can be greater than the third pass voltage.

According to some aspects, the first word lines can further include second unselected word lines adjacent to the selected word line.

According to some aspects, the first unselected word lines can be on a first side of the selected word line and the second unselected word lines can be on a second side of the selected word line. The first side and the second side can be opposite sides of the selected word line.

According to some aspects, the performing the programming operation can further includes applying a fifth pass voltage to the second unselected word lines. The fifth pass voltage can be smaller than the first pass voltage, According to some aspects, the applying the programming voltage signal, the applying the first pass voltage and the applying the second pass voltage can be performed at substantially the same time.

Some aspects of this disclosure relate to a three-dimensional (3D) NAND memory device. The 3D NAND memory device can include a memory array comprising blocks. Each block includes first memory cells and second memory cells. The first memory cells and the second memory cells are connected in series to a bit line. The 3D NAND memory device can further include a word line driver; and a controller configured to control the word line driver to performing a programming operation on a memory cell in the first memory cells. The memory cell is controlled by a selected word line of first word lines corresponding to the first memory cells. The first word lines comprises first unselected word lines adjacent to the selected word line. The performing the programming operation includes applying a programming voltage signal to the selected word line to program the memory cell into a target state. The performing the programming operation further includes applying a first pass voltage to the first unselected word lines. The performing the programming operation further includes applying a second pass voltage to second word lines corresponding to the second memory cells.

According to some aspects, the second pass voltage can be lower than the first pass voltage.

According to some aspects, the performing the programming operation can be subsequent to performing an erase operation on the first group of the memory cells.

According to some aspects, the first unselected word lines can be adjacent to the second word lines.

According to some aspects, the second pass voltage can be adjusted based on a position of the selected word line.

According to some aspects, the position of the selected word line can be determined by a number of the first unselected word lines between the selected word line and the second word lines.

According to some aspects, the second pass voltage can be adjusted to a third pass voltage when a first number of the first unselected word lines are between the selected word line and the second word lines. The second pass voltage can be adjusted to a fourth pass voltage different from the third pass voltage when a second number of the first unselected word lines are between the selected word line and the second word lines. The second number can be different from the first number.

According to some aspects, the second number can be smaller than the first number. And the fourth pass voltage can be greater than the third pass voltage.

This Summary is provided merely for purposes of illustrating some aspects to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the present disclosure and, together with the description, further serve to explain the principles of the disclosure and enable a person of skill in the relevant art(s) to make and use the disclosure.

Figure 1:
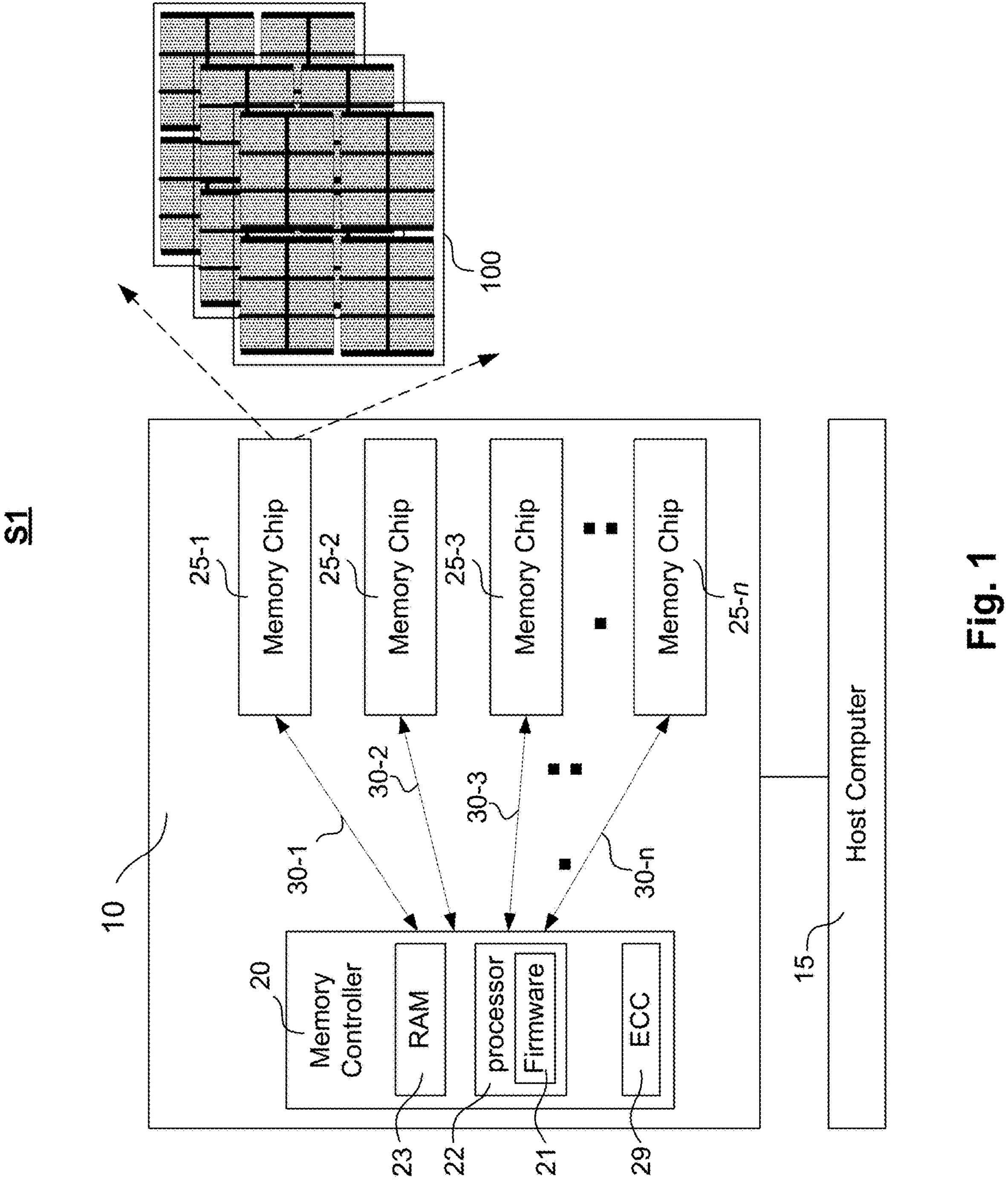
FIGS. 1, 2A and 2B illustrate a memory system with one or more memory chips, according to some implementations.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one implementation," "an implementation," "an example implementation," "some implementations," etc., indicate that the implementation described can include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to affect such feature, structure, or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" or "approximately" indicate the value of a given quantity that can vary based on a particular technology node associated with the subject semiconductor device. Based on the particular technology node, the terms "about" or "approximately" can indicate a value of a given quantity that varies within, for example, 10-30% of the value (e.g., +10%, +20%, or +30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

A memory device can include a memory array comprising blocks. Each block can include one or more memory cells, and the memory device may perform an erasing operation of individual blocks. However, a high erasing speed may not be achieved by the erasing operation based on a block of the memory device, due to higher number of storage layers and unit storage bits. A block can include multiple vertically stacked levels or decks, such as formed by a double-stack process. Each level can include multiple vertically stacked memory cells. In order to achieve effective reading, writing, and erase operations in a memory device having multiple levels, each level can enable erase operations individually. In order to increase the erasing speed, the memory device may perform an erasing operation based on a level of the block. For example, the memory device may perform an erasing operation to only erase upper level cells or lower level cells, or both.

A memory device can program a memory cell of the memory device by applying a voltage, such as a programming voltage, to the memory cell to perform a programming operation. In some aspects, memory cells in a same memory bock of the memory device can share the same word line (WL) and can be programmed simultaneously. During the programming operation, a row decoder can select a WL associated with the memory cell to send a programming voltage signal to program the memory cell into a target state. The unselected WLs in the memory block can be usually biased to a voltage level called "Vpass" to minimize the program disturbance on unselected cells of the memory block.

A known issue called "Vpass disturb" can occur when one or more unselected cells become inadvertently "soft-programed" as associated with the unselected WLs. For example, during the programming operation, the Vpass voltage can be applied to the unselected WLs corresponding to the non-programmed cells of a programming string. At that time, the potential difference between the gate and the channel of the non-programmed cells can form an electric field. The magnitude of the electric field may not be large enough to allow electrons to easily enter a charge-trapping layer. However, due to the electric field, a certain probability (e.g., number) for electrons to enter the charge-trapping layer may occur, especially when the isolation performance of the tunneling layer is poor or degraded. Accordingly, the non-programmed cells may be affected by the applied Vpass voltage, which is often called Vpass disturb. Thus, the performance of the memory device may be impacted. Testing or re-programming of the memory device may be needed to solve the Vpass disturb issues.

As described above, in order to achieve effective reading, writing, and erase operations in a memory device having multiple levels, each level can enable erase operations individually. In order to increase the erasing speed, memory device may perform an erasing operation based on a level of the block. For example, memory device may perform an erasing operation to only erase first or upper level cells, while the erasing operation is not performed on the second or lower level cells. Subsequent to the erasing operation to the upper level cells, upper level cells can be programmed. Lower level cells in a programmed state may suffer worse Vpass disturb, due to the erase and/or programming operation of the upper level cells.

FIG. 1 illustrates a block diagram of an electronic device S1 having a memory system 10, according to some implementations. In some implementations, the electronic device S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Memory system 10 (e.g., a NAND memory system) can include a memory controller 20 and one or more semiconductor memory devices 25-1, 25-2, 25-3, . . . , 25-*n*. Each semiconductor memory device 25 (hereafter just "memory device") can be a NAND device (e.g., "flash," "NAND flash" or "NAND"). Memory system 10 can communicate with a host computer 15 through memory controller 20, where memory controller 20 can be connected to one or more memory chips 25-1, 25-2, 25-3, . . . , 25-*n*, via one or more memory channels 30-1, 30-2, 30-3, . . . , 30-*n*. In some implementations, each memory device 25 can be managed by memory controller 20 via one or more memory channels 30-1, 30-2, 30-3, . . . , 30-*n*.

In some implementations, host computer 15 can include a processor of an electronic device, such as a central processing unit (CPU), or a system-on-chip (SoC), such as an application processor (AP). Host computer 15 can send data to be stored at memory system 10 and/or can retrieve data from stored in memory system 10.

In some implementations, memory controller 20 can handle I/O requests received from host computer 15, ensure data integrity and efficient storage, and manage memory device 25. To perform these tasks, memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory device 25 (e.g., actual locations where the data is stored). Memory controller 20 also runs firmware 21 to manage defective memory blocks in the memory device 25, where the firmware 21 can remap the logical address to a different physical address, i.e., move the data to a different physical address. Memory controller 20 can also include one or more memories 23 (e.g., DRAM, SRAM, EPROM, etc.), which can be used to store various metadata used by the firmware 21. In some implementations, the memory controller 20 can also perform error recovery through an error correction code (ECC) engine 29. ECC is used to detect and correct the raw bit errors that occur within each memory device 25.

In some implementations, the memory channels 30 can provide data and control communication between the memory controller 20 and each memory device 25 via a data bus. The memory controller 20 can select one of the memory device 25 according to a chip enable signal.

In some implementations, each memory device 25 in FIG. 1 can include one or more memory devices 100, where each memory device can be a NAND memory.

Figure 2B:
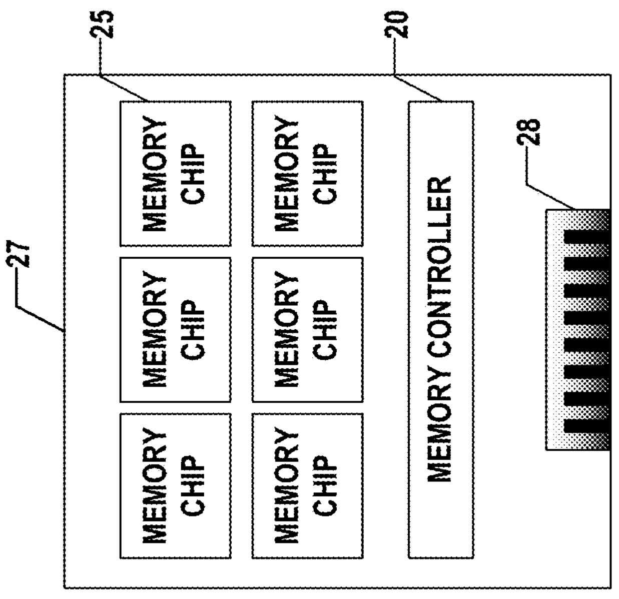
Figure 2A:
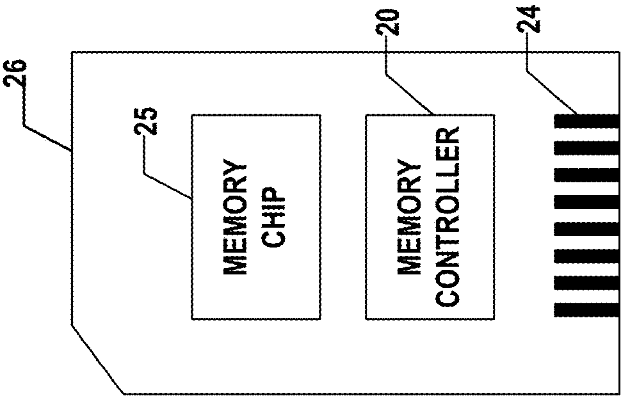

In some implementations, memory controller 20 and one or more memory device 25 can be integrated into various types of storage devices, for example, be included in the same package, such as a universal Flash storage (UFS) package or an eMMC package. That is, memory system 10 can be implemented and packaged into different types of end electronic products. In one example as shown in FIG. 2A, memory controller 20 and a single memory device 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory devices 25 can be integrated into a solid state drive (SSD) 27. SSD 27 can further include a SSD connector 28 coupling SSD 27 with a host (e.g., the host computer 15 in FIG. 1).

Figure 3:
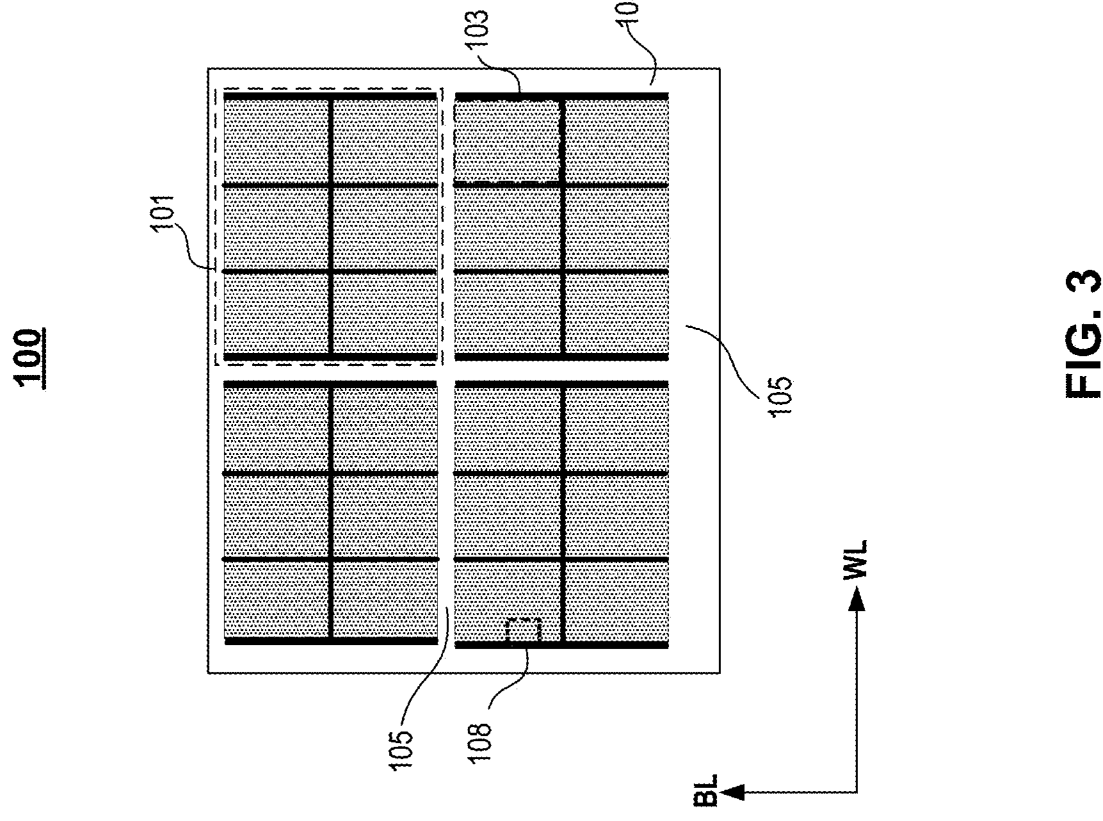
FIG. 3 illustrates a schematic diagram of a memory device, according to some implementations.

FIG. 3 illustrates a top-down view of a memory device 100, according to some implementations. The example configuration shown in FIG. 3 is given as a non-limiting example and it is to be appreciated that memory is scalable. In some implementations, memory device 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory device 100 can include, for example, four memory planes 101. Each memory plane 101 can include, for example, six memory blocks 103. Each memory block 103 can include a plurality of memory cells 108, where each memory cell 108 can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3.

In some implementations, memory device 100 can also include a periphery region 105, an area surrounding memory planes 101. The periphery region 105 can include many digital, analog, and/or mixed-signal circuits to support functions of the memory device, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some implementations, the arrangement of the memory planes 101 in the memory device 100 and the arrangement of the memory blocks 103 in each memory plane 101 illustrated in FIG. 3 are only used as an example, which does not limit the scope of the present disclosure.

Figure 4:
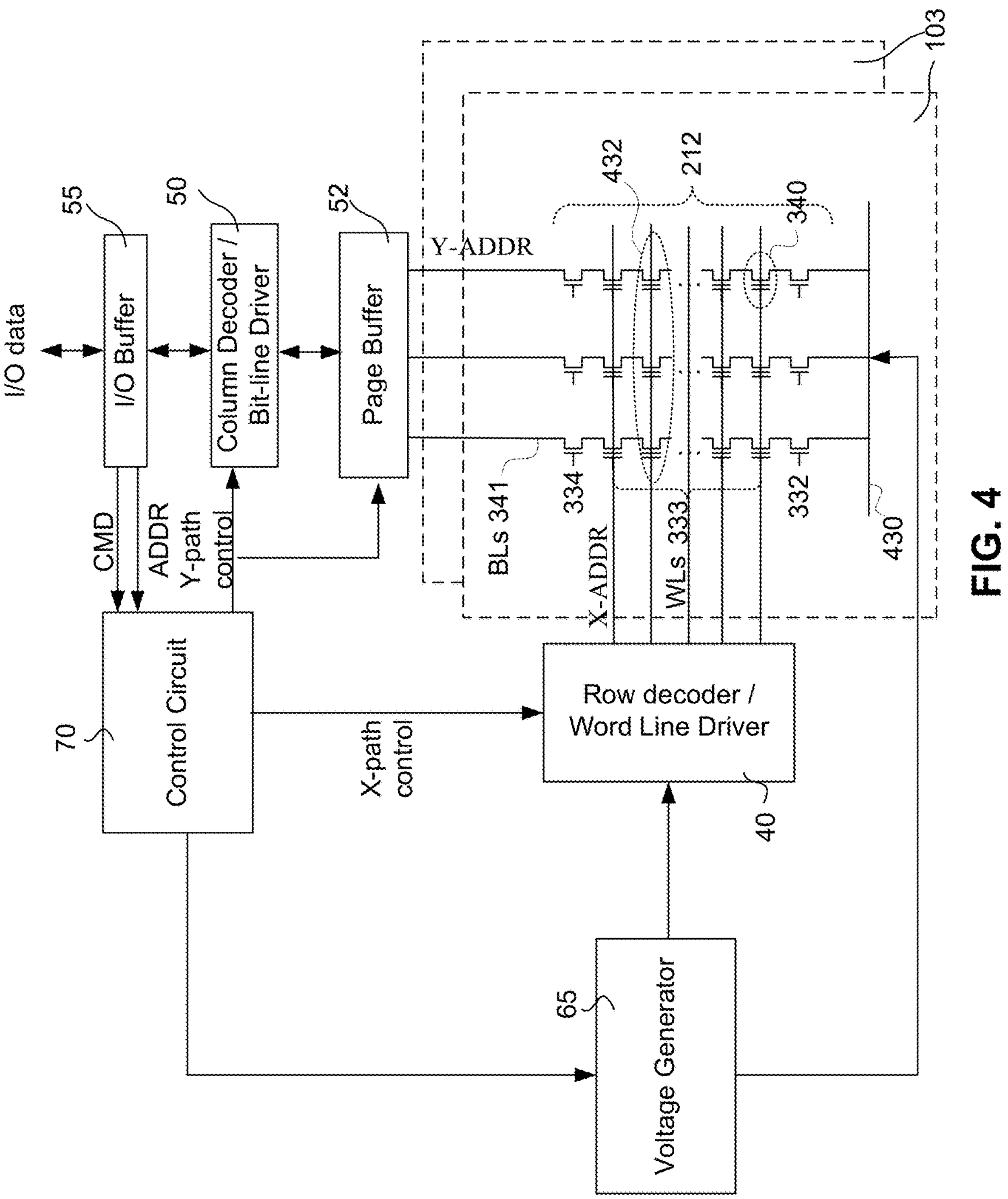
FIG. 4 illustrates a schematic of a memory device, according to some implementations.

FIG. 4 illustrates a schematic diagram of the memory device 100, according to some implementations. In some implementations, memory device 100 can include one or more memory blocks 103. Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate ("LSG") 332 and a top select gate ("TSG") 334, respectively. Lower select gates ("LSGs") can also be referred to as bottom select gates ("BSGs"). The drain terminal of the top select transistor 334-T can be connected to a bit line 341, and the source terminal of the lower select transistor 332-T can be connected to an array common source ("ACS") 430. ACS 430 can be shared by the memory strings 212 in an entire memory block, and is also referred to as the common source line.

In some implementations, memory device 100 can also include a periphery circuit that can include many digital, analog, and/or mixed-signal circuits to support functions of the memory block 103, for example, a page buffer 52, a row decoder/word line driver 40, a column decoder/bit line driver 50, a controller 70, a voltage generator 65 and an input/output buffer 55. Controller 70 can include one or more control circuits. In some aspects, controller 70 can include one or more registers, buffers, and/or memories to store one or more trim settings as described in the present disclosure. These circuits can include active and/or passive semiconductor devices, such as transistors, diodes, capacitors, resistors, etc., as would be apparent to a person of ordinary skill in the art.

In some implementations, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer 52 via bit lines ("BLs") 341. Row decoder/word line driver 40 can select one of the memory blocks 103 on the memory device 100 in response to an X-path control signal provided by the controller 70. Row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage Vpass to an unselected word line according to the X-path control signal received from the controller 70.

In some implementations, column decoder/bit line driver 50 can transfer an inhibit voltage $V_{inhibit}$ to an unselected bit line and connect a selected bit line to ground according to a Y-path control signal received from controller 70. In the other words, column decoder/bit line driver 50 can be configured to select or unselect one or more memory strings 212 according to the Y-path control signal from controller 70. The page buffer 52 can be configured to read and program (write) data from and to the memory block 103 according to the control signal Y-path control from the controller 70. For example, the page buffer 52 can store one page of data to be programmed into one memory page 432. In another example, page buffer 52 can perform verify operations to ensure that the data has been properly programmed into each memory cell 340. In yet another example, during a read operation, page buffer 52 can sense current flowing through the bit line 341 that reflects the logic state (i.e., data) of the memory cell 340 and amplify small signal to a measurable magnification.

In some implementations, in order to increase the efficiency of a write operation, column decoder/bit line driver 50 can transfer a bias voltage $V_{bias}$ to a selected bit line according to a Y-path control signal from controller 70 and the data to be programmed from page buffer 52.

In some implementations, input/output buffer 55 can transfer the I/O data from/to the page buffer 52 as well as addresses ADDR or commands CMD to the controller 70. In some implementations, input/output buffer 55 can function as an interface between memory controller 20 (in FIG. 1) and memory device 100 on memory device 25.

In some implementations, controller 70 can control page buffer 52 and row decoder/word line driver 40 in response to the commands CMD transferred by the input/output buffer 55. During the program operation, controller 70 can control row decoder/word line driver 40 and page buffer 52 to program a selected memory cell. During the read operation, controller 70 can control row decoder/word line driver 40 and the page buffer 52 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some implementations, voltage generator 65 can generate voltages to be supplied to word lines and bit lines under the control of controller 70. The voltages generated by voltage generator 65 include the read voltage $V_{read}$, the program voltage $V_{pgm}$, the pass voltage $V_{pass}$, the inhibit voltage $V_{inhibit}$, the bit line bias voltage $V_{bias}$, etc.

It is noted that the arrangement of the electronic components in the memory system 10 and the memory device 100 in FIGS. 1, 2A-2B, and 3-4 are shown as non-limiting examples. In some implementations, memory system 10 and memory device 100 can have other layout and can include additional components. Components (e.g., controller 70, I/O buffer 55) on memory device 100 shown in FIG. 4 can also be moved off memory device 100, as a stand-alone electric component in the memory system 10. Components (e.g., controller 70, I/O buffer 55) on memory device 100 shown in FIG. 4 can also be moved to other components in memory system 10, for example, a portion of controller 70 can be combined with memory controller 20 and vice versa.

Figure 5:
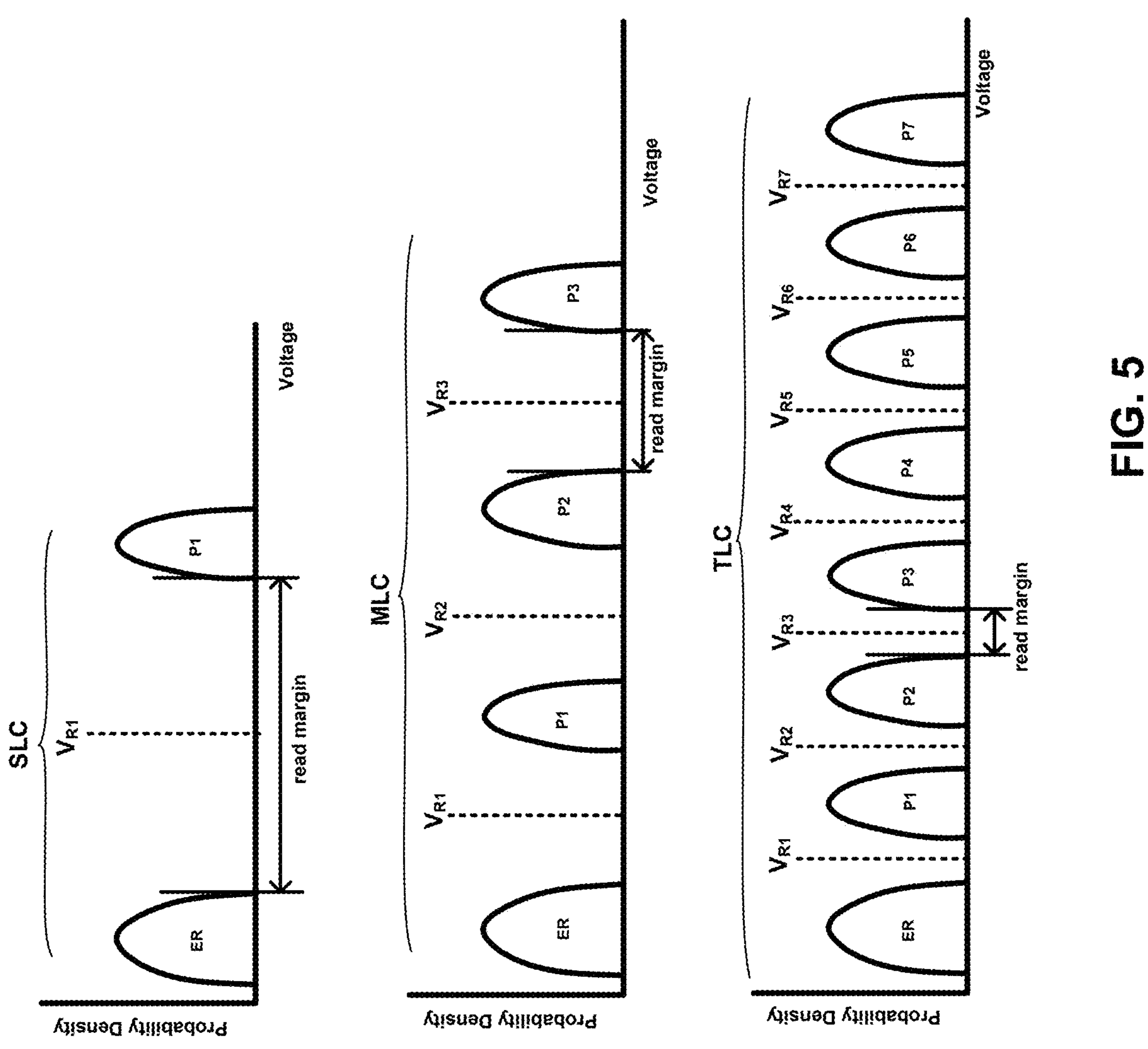
FIG. 5 illustrates an example threshold voltage distribution of a memory device, according to according to some aspects of the disclosure.

FIG. 5 illustrates a threshold voltage $V_{th}$ distribution of a NAND flash memory programmed in the SLC, MLC, or TLC modes, according to some implementations. In some implementation of the SLC mode, state P1 corresponds to state S1. In some implementation of the MLC mode, states P1-P3 corresponds to states M1-M3. In some implementation of the TLC mode, states P1-P7 corresponds to states T1-T7. In some implementations, each state of the memory cells can correspond to a specific range of threshold voltage $V_{th}$, where the threshold voltage $V_{th}$ distribution of each state can be represented by a probability density. In some implementations, the states other than the erased state ER can be programmed by using an incremental step pulse programming (ISPP) scheme, such that the programming voltage $V_{pgm}$ can be incrementally increased by adding a step pulse $V_{step}$. For example, the eight TLC states can be programmed from state ER with a lower threshold voltage to state T7 with a highest threshold voltage.

In some implementations, after programming, the eight TLC states ER and T1-T7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states T1-T7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer 52, the threshold voltage $V_{th}$ or the state of the target memory cell can be verified.

In some implementations, as described above, to determine the two states ER and S1 stored in the SLC mode, it is sufficient to rely on just the read reference voltage $V_{R1}$. To determine the four states ER and M1-M3 in the MLC mode, the read reference voltages $V_{R1}$, $V_{R2}$ and $V_{R3}$ can be used. To determine the eight states ER and T1-T7 for the TLC mode, the read reference voltages $V_{R1}$-$V_{R7}$ can be used. For example, in the TLC mode, the threshold voltage of state ER is below $V_{R1}$, and the threshold voltage of state T7 is above $V_{R7}$, where the threshold voltages of state T1 is between $V_{R1}$ and $V_{R2}$. States T2-T6 can be determined similarly.

Figure 6:
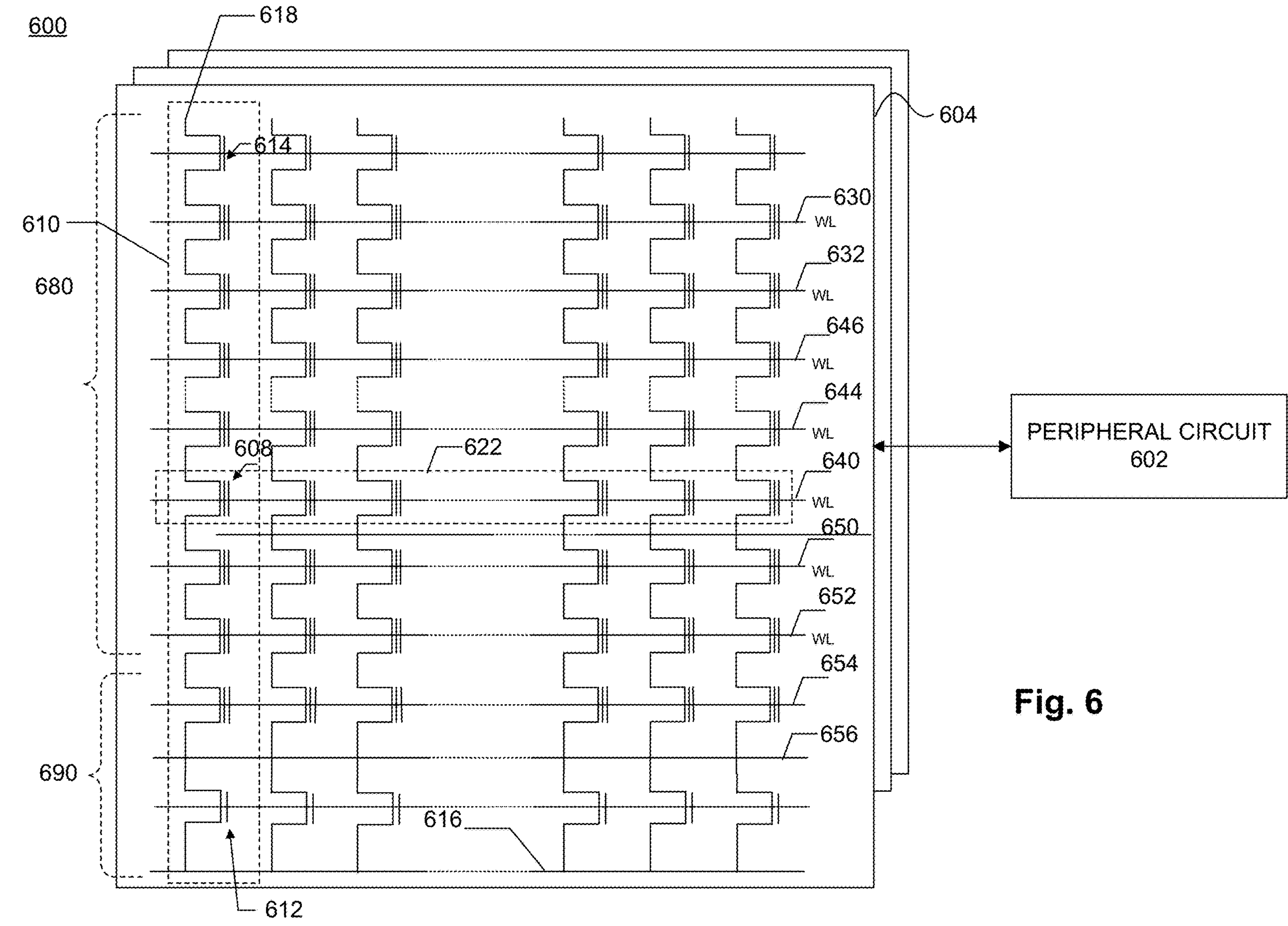
FIG. 6 illustrates an example schematic circuit diagram of a memory device, according to some aspects of the disclosure.

FIG. 6 illustrates an example schematic circuit diagram 600 of a memory device, according to aspects of the present disclosure. The example schematic circuit diagram 600 includes a memory block 604 and a peripheral circuit 602.

In some aspects, the example schematic circuit diagram 600 includes a plurality of memory strings 610, each memory string 610 having a plurality of memory cells 608. The memory string 610 also includes at least one field effect transistor (e.g., MOSFET) at each end, which is controlled by a lower select gate (LSG) 612 and a top select gate (TSG) 614, respectively. The memory cell 608 can be controlled by a control gate, where the control gate can be connected to a word line 640 of the example schematic circuit diagram 600. The drain terminal of the TSG 614 can be connected to the bit line 618, and the source terminal of the LSG 612 can be connected to an array common source (ACS) 616. The ACS 616 can be shared by the memory strings 610 in an entire memory block, and is also referred to as the common source line.

In some aspects, the example schematic circuit diagram 600 can be formed based on the floating gate technology. In some aspects, the example schematic circuit diagram 600 can be formed based on charge trapping technology. The NAND flash memory based on charge trapping can provide high storage density and high intrinsic reliability. Storage data or logic states (e.g., threshold voltage $V_{th}$ of the memory cell 608) depends on the amount of charge trapped in a storage layer. In some aspects, the memory block 604 can be a three-dimensional (3D) memory device, and the example schematic circuit diagram 600 can be a 3D memory array, where the memory cells 608 can be vertically stacked on top of each other.

Memory block 604 can include multiple vertically stacked levels or decks, such as formed by a double-stack process. As shown in FIG. 6, memory block 604 includes a first level 680 and a second level 690. Each level can include multiple vertically stacked memory cells. Further, each level can be processed separately for effective read, write, and/or erase operations. For example, each level can perform an erase operation independently from other levels. In addition, read and write operations can be performed in a memory page that includes a plurality of memory cells sharing a same WL. The example structures of the memory device including two levels are described above in FIG. 6, however, the number of levels in memory block 604 is not limited to two, and memory block 604 may include three, fourth or any other number of levels.

In a NAND flash memory, read and write operations can be performed based on one or more logical pages, which can be associated with memory block 604, and/or memory page 622, which includes all memory cells 608 sharing the same word line. In some aspects, a program voltage may be sent to the control gate of all memory cells 608 via a selected word line (e.g., WL 640) in the memory page 622 to program at least one of memory cells 608 sharing the same word line. A row address X-ADDR of memory page 622 can be selected by a Row decoder/Word-Line Driver, such as Row decoder/Word-Line Driver 40 in FIG. 4. The row address can include a page index PD, a block index BD and a plane index PL to identify memory page 622, memory block 604, and memory plane 101 (in FIG. 3), respectively. The column address Y-ADDR can identify a byte or a word in the data of the memory page 622.

In some aspects, while one or more memory cells in memory page 622 receive the program voltage, other, unselected memory cells may receive a pass voltage via one or more unselected word line (e.g., WL 630 and WL 656), which is high enough to provide the unselected memory cells in a conductive state but not high enough to program them.

In some aspects, the one or more memory cells may be programmed in a word line programming order, one word line at a time, starting at one end of a NAND string and continuing to the other end of the NAND string. In some aspects, the one or more memory cells may be programmed starting from WL with a low page index to WL with a high page index, one word line at a time.

In a NAND memory, the memory cell 608 can be in an erase state ER or a programmed state. Initially, all memory cells 608 in the example schematic circuit diagram 600 can be reset to the erase state ER as logic "1" by implementing a negative voltage difference between control gates and source terminals of the memory cells (e.g., the array common source 616) such that all the trapped electronic charges in the storage layer of the memory cells 608 can be removed. For example, the negative voltage difference can be induced by setting the control gates of the memory cells 608 to ground, and applying a high positive voltage to the array common source 616. At the erase state ER ("state ER"), the threshold voltage $V_{th}$ of the memory cells 608 can be reset to the lowest value, and can be measured or sensed at the bit line 618.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 608, and thereby increase the threshold voltage $V_{th}$ of the memory cell 608. Thus the memory cell 608 is programmed to the programmed state.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

Figure 7:
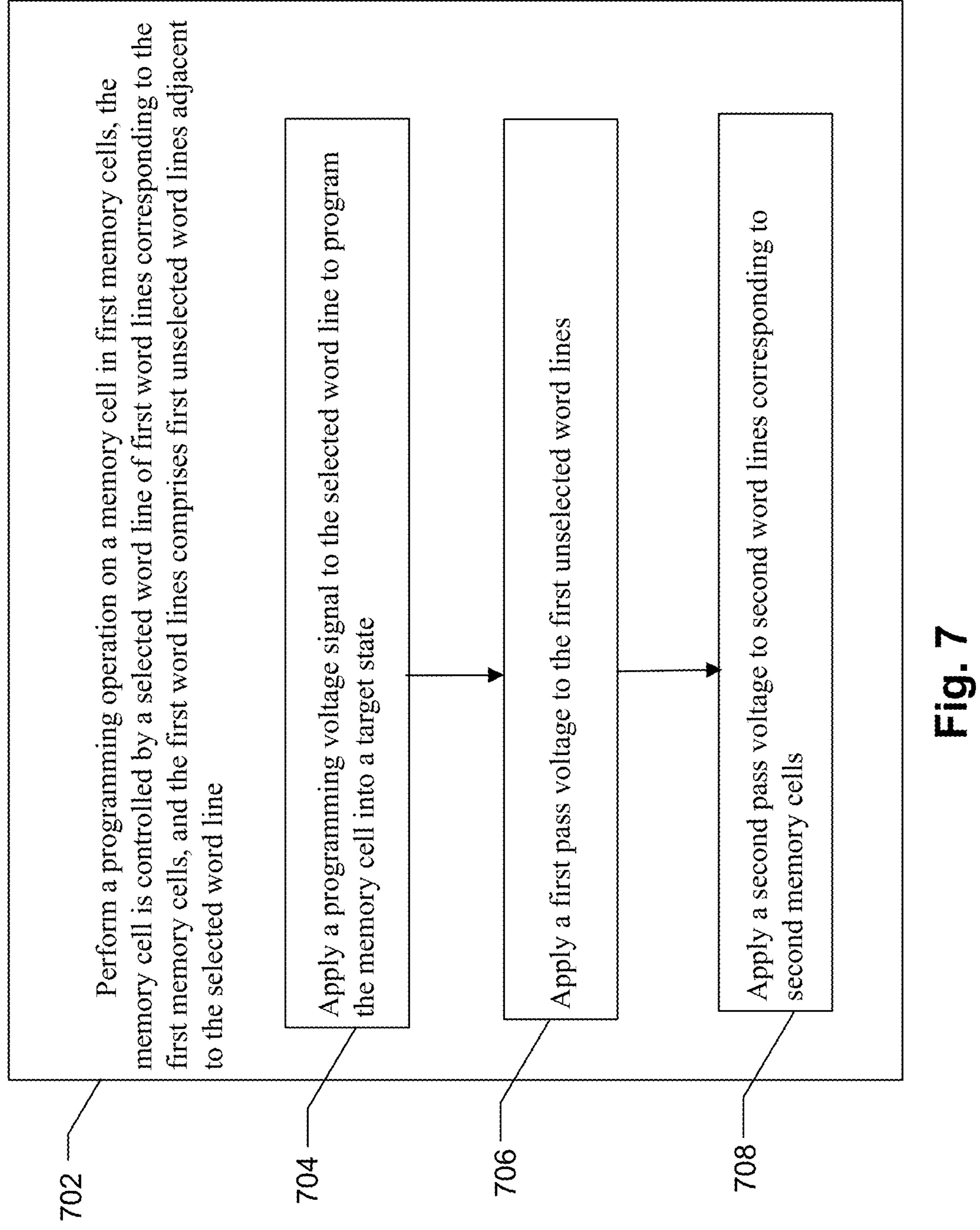
FIG. 7 illustrates an example process flow of performing a programming operation, according to aspects of the present disclosure.

FIG. 7 illustrates an example process flow 700 of performing a programming operation, according to aspects of the present disclosure. FIG. 7 can be described with regard to elements of FIGS. 1-6. The example 700 can be performed by a memory system (for example, the memory system 10 of FIG. 1). It should be appreciated that the process flow 700 is not exhaustive and that other operation steps can be performed as well before, after, or between any of the illustrated operation steps. In some implementations, some operation steps of the process flow 700 can be omitted or other operation steps can be included, which are not described here for simplicity. In some implementations, operation steps of the process flow 700 can be performed in a different order and/or vary.

In some implementations, at 702, a programming operation is perform on a memory cell in first memory cells. In some aspects, the memory cell is controlled by a selected word line of first word lines corresponding to the first memory cells. The first word lines can include first unselected word lines adjacent to the selected word line.

As described above, memory block 604 can include first level 680 and second level 690. Each level can include multiple vertically stacked memory cells. In some aspects, first memory cells may correspond to memory cells in first level 680. Second memory cells may correspond to memory cells in second level 690. In some aspects, the first memory cells and the second memory cells can be connected in series to a bit line, such as bit line 618.

In some implementations, the performing the programming operation at 702 includes 704, 706 and 708.

In some implementations, at 704, a programming voltage signal is applied to the selected word line (e.g., WL 640) to program the memory cell into a target state (e.g., the state P1).

In some implementations, at 706, a first pass voltage is applied to the first unselected word lines (e.g., WL 650, 652).

In some implementations, at 708, a second pass voltage is applied to second word lines (e.g., WL 654, 656) corresponding to the second memory cells. In some implementations, the second pass voltage can be lower than the first pass voltage.

In some implementations, the performing the programming operation can be subsequent to performing an erase operation on the first memory cells. As described above, each level in a memory block can be processed separately for effective read, write, and/or erase operations. For example, each level can perform an erase operation independently from other levels.

In some implementations, the first unselected word lines (e.g., WL 650, 652) can be adjacent to the second word lines (e.g., WL 654, 656). In some implementations, the second pass voltage can be adjusted based on a position of the selected word line (e.g., WL 640). In some implementations, the position of the selected word line can be determined by a number of the first unselected word lines (e.g., WL 650, 652) between the selected word line (e.g., WL 640) and the second word lines (e.g., WL 654, 656).

In some implementations, second pass voltage can be adjusted to a third pass voltage when a first number of the first unselected word lines are between the selected word line and the second word lines. In some implementations, the second pass voltage can be adjusted to a fourth pass voltage different from the third pass voltage when a second number of the first unselected word lines are between the selected word line and the second word lines. The second number can be different from the first number.

In some implementations, the second number can be smaller than the first number, and the fourth pass voltage can be greater than the third pass voltage.

In some implementations, the first word lines can further include second unselected word lines (e.g., WL 630, 632, 646, 644) adjacent to the selected word line ((e.g., WL 640).

In some implementations, the first unselected word lines can be on a first side of the selected word line and the second unselected word lines can be on a second side of the selected word line. The first side and the second side can be opposite sides of the selected word line.

In some implementations, the performing the programming operation can further include: applying a fifth pass voltage to the second unselected word lines. The fifth pass voltage can be smaller than the first pass voltage.

In some implementations, the applying the programming voltage signal, the applying the first pass voltage and the applying the second pass voltage can be performed at substantially the same time.

Figure 8B:
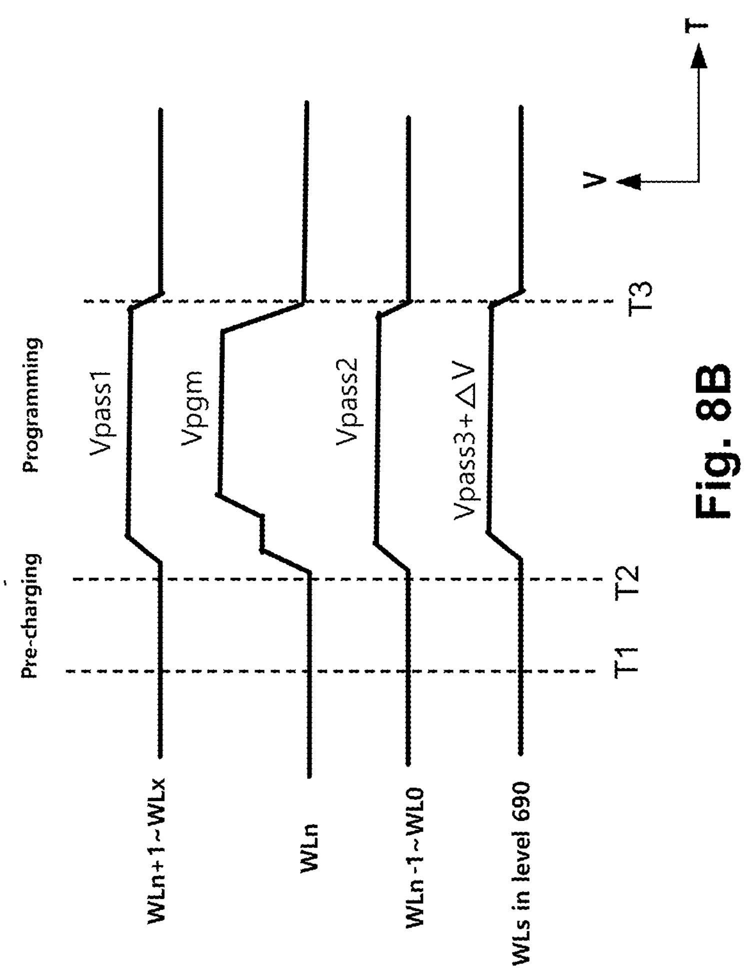
FIG. 8B illustrates example voltage waveform timing diagrams of a memory device with a configuration in FIG. 8A, according to some implementations.
Figure 8A:
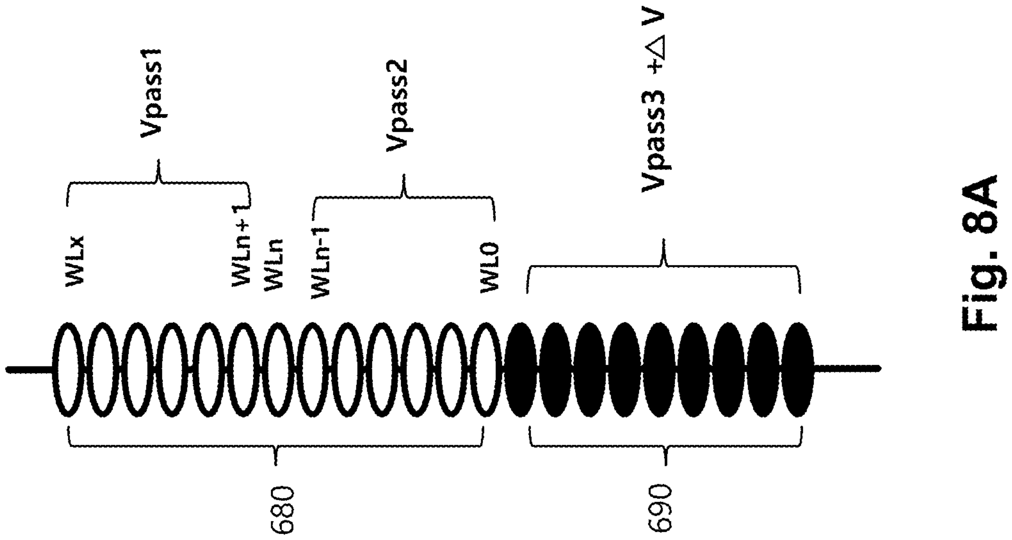
FIG. 8A illustrates an example configuration of a plurality of pass voltage distributions and corresponding word lines, according to some implementations.

FIG. 8A illustrates an example configuration of a plurality of pass voltage distributions and corresponding word lines, according to some implementations. However, FIG. 8A is not limited to the specific aspects depicted in those figures and other configurations may be used as will be understood by those skilled in the art.

In FIG. 8A, after applying a plurality of pass voltages and a programming voltage during a programming operation as described in FIG. 7, a first configuration of a plurality of pass voltages applied and corresponding word lines is illustrated. In this configuration, a memory string (e.g., memory string 610) can include a plurality of memory cells (e.g., memory cells 608) in first level 680 and second level 690. First level 680 perform an erase operation independently from second level 690.

Subsequent to the erase operation of first level 680, a programming operation can be performed in first level 680. The programming operation can be performed in first level 680 in a bit line pre-charge mode using forward programming. For example, the programming operation can be performed in an order from a source side or terminal to a drain side or terminal. The source side or terminal can be close to the bottom side of second level 690, and the drain side or terminal can be close to the upper side of first level 680 (e.g., WLx). The memory cells in first level 680 can correspond to a plurality of word lines including WL0 to WLx as shown in FIG. 8A. In some aspects, WL0 to WLx can be arranged in the order from starting at one end of the memory string and continuing to the other end of the memory string. In some aspects, a page index of WLx to WL0 can be in ascending order. In some aspects, WL0 to WLx can also correspond to different page index zones. The programming operation can be performed in first level 680 in the order from starting at WL0 and continuing to WLx.

In some aspects, after applying a plurality of pass voltages and a programming voltage during a programming operation as described in FIG. 7, a programming voltage Vpgm can be applied to selected word line WLn. A plurality of pass voltages including Vpass1, Vpass2, Vpass3+ΔV, can be applied to the corresponding word lines as shown in FIG. 8A. In some aspects, Vpass1, Vpass2, Vpass3+ΔV, can correspond to the fifth pass voltage, the first pass voltage, the second pass voltage as described with reference to FIG. 7, respectively.

As described with reference to FIG. 7, the second pass voltage (e.g., Vpass3+Δ V) can be adjusted based on a position of the selected word line. In some implementations, the position of the selected word line can be determined by a number of the first unselected word lines, such as WLn−1 to WL0, between the selected word line and the second word lines, such as word lines in second level 690.

In some aspects, the second pass voltage (e.g., Vpass3+ΔV) and a position of the selected word line can be illustrated in a dynamic settings table as Table 1 below:

TABLE 1

Dynamic settings table

| Selected WLn in level 680 | Section | Vpass3 + ΔV |
|---|---|---|
| WLy-WLx | Sec_x | Vpass3 + ΔV_sec x |
| . . . | . . . | |
| . . . | . . . | |
| WL11-20 | Sec_B | Vpass3 + ΔV_sec b |
| WL0-10 | Sec_A | Vpass3 + ΔV_sec a |

As shown in Table 1, the second pass voltage (e.g., Vpass3+ΔV) can be adjusted based on a position of the selected word line WLn. For example, a section in first level 680 where the selected word line WLn is located can be determined. A magnitude of the second pass voltage can be adjusted based on the section. For example, when the selected word line WLn is within WL0 to WL10, then a first section in first level 680 can be determined. A magnitude of the second pass voltage can be adjusted based on the first section. When the selected word line WLn is within WL11 to WL20, then a second section in first level 680 can be determined. A magnitude of the second pass voltage can be adjusted based on the second section.

FIG. 8B illustrates example voltage waveform timing diagrams of a memory device with a configuration in FIG. 8A, according to some implementations. However, FIG. 8B is not limited to the specific aspects depicted in those figures and other configurations may be used as will be understood by those skilled in the art.

A time period from time T1 to time T2 may be referred to as a pre-charging period. In some aspects, one or more bit lines, such as bit line 618 can be pre-charged via page buffer 52. A time period from time T2 to time T3 may be referred to as a programming period. During the programming period, a voltage applied to a selected word line WLn can be ramped up from a low level (e.g., ground level) to a high level (e.g., a programming voltage $V_{pgm}$). A voltage applied to word lines WLn+1 to WLx can be ramped up from a low level (e.g., ground level) to a high level (e.g., a pass voltage Vpass1). A voltage applied to word lines WLn−1 to WL0 can be ramped up from a low level (e.g., ground level) to a high level (e.g., a pass voltage Vpass2). A voltage applied to word lines in second level 690 can be ramped up from a low level (e.g., ground level) to a high level (e.g., a pass voltage Vpass3+ΔV).

Figure 9B:
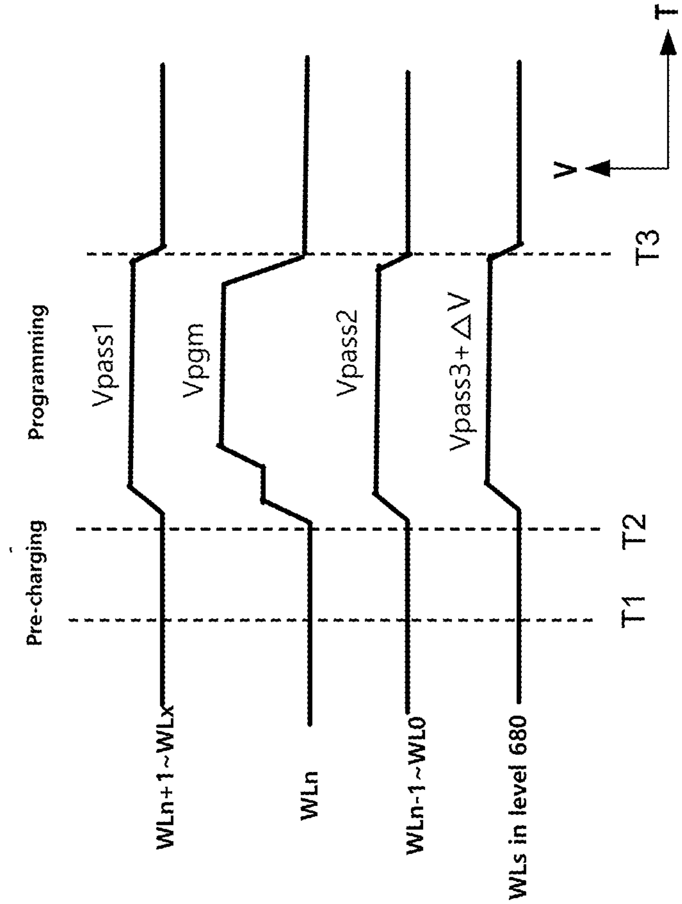
FIG. 9B illustrates example voltage waveform timing diagrams of a memory device with a configuration in FIG. 9A, according to some implementations.
Figure 9A:
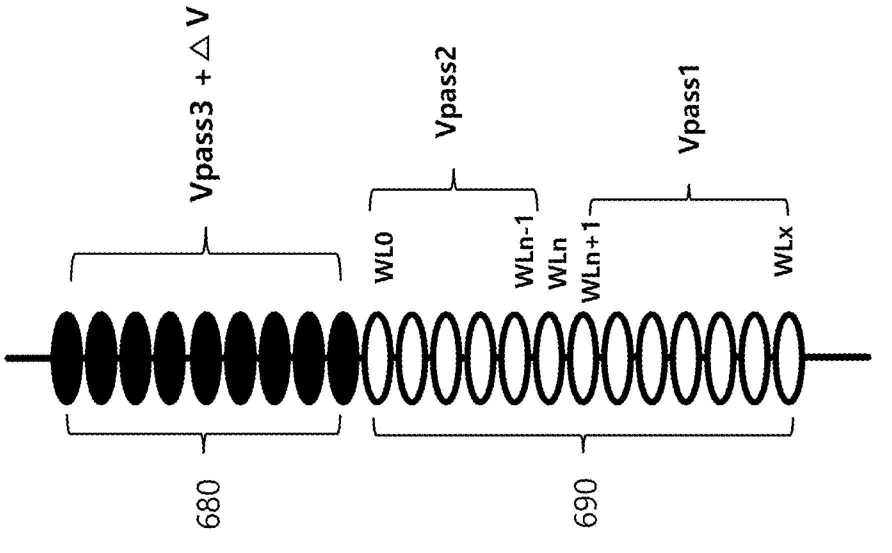
FIG. 9A illustrates an example configuration of a plurality of pass voltage distributions and corresponding word lines, according to some implementations.

FIG. 9A illustrates an example configuration of a plurality of pass voltage distributions and corresponding word lines, according to some implementations. However, FIG. 9A is not limited to the specific aspects depicted in those figures and other configurations may be used as will be understood by those skilled in the art.

In FIG. 9A, after applying a plurality of pass voltages and a programming voltage during a programming operation as described in FIG. 7, a second configuration of a plurality of pass voltages applied and corresponding word lines is illustrated.

In this configuration, a memory string (e.g., memory string 610) can include a plurality of memory cells (e.g., memory cells 608) in first level 680 and second level 690. First level 680 perform an erase operation independently from second level 690.

Subsequent to the erase operation of second level 690, a programming operation can be performed in second level 690. The programming operation can be performed in second level 690 in an ACS pre-charge mode using reverse programming. For example, the programming operation can be performed in an order from a drain side or terminal to a source side or terminal. The source side or terminal can be close to the bottom side of second level 690 and the drain side or terminal can be close to the upper side of first level 680 (e.g., WLx). The memory cells in second level 690 can correspond to a plurality of word lines including WL0 to WLx as shown in FIG. 9A. In some aspects, WL0 to WLx can be arranged in the order from starting at one end of the memory string and continuing to the other end of the memory string. In some aspects, a page index of WLx to WL0 can be in ascending order. In some aspects, WL0 to WLx can also correspond to different page index zones. The programming operation can be performed in second level 690 in the order from starting at WL0 and continuing to WLx.

In some aspects, after applying a plurality of pass voltages and a programming voltage during a programming operation as described in FIG. 7, a programming voltage Vpgm can be applied to selected word line WLn. A plurality of pass voltages including Vpass1, Vpass2, Vpass3+ΔV, can be applied to the corresponding word lines as shown in FIG. 9A. In some aspects, Vpass1, Vpass2, Vpass3+ΔV, can correspond to the fifth pass voltage, the first pass voltage, the second pass voltage as described with reference to FIG. 7, respectively.

As described with reference to FIG. 7, the second pass voltage (e.g., Vpass3+Δ V) can be adjusted based on a position of the selected word line. In some implementations, the position of the selected word line can be determined by a number of the first unselected word lines, such as WL0 to WLn+1, between the selected word line and the second word lines, such as word lines in first level 680.

In some aspects, the second pass voltage (e.g., Vpass3+ΔV) and a position of the selected word line can be illustrated in a dynamic settings table as Table 2 below:

TABLE 2

Dynamic settings table

| Selected WLn in level 690 | Section | Vpass3 + ΔV |
|---|---|---|
| WLy-WLx | Sec_x | Vpass3 + ΔV_sec x |
| . . . | . . . | |
| . . . | . . . | |
| WL11-20 | Sec_B | Vpass3 + ΔV_sec b |
| WL0-10 | Sec_A | Vpass3 + ΔV_sec a |

As shown in Table 2, the second pass voltage (e.g., Vpass3+ΔV) can be adjusted based on a position of the selected word line WLn. For example, a section in second level 690 where the selected word line WLn is located can be determined. A magnitude of the second pass voltage can be adjusted based on the section. For example, when the selected word line WLn is within WL0 to WL10, then a first section in second level 690 can be determined. A magnitude of the second pass voltage can be adjusted based on the first section. When the selected word line WLn is within WL11 to WL20, then a second section in second level 690 can be determined. A magnitude of the second pass voltage can be adjusted based on the second section.

FIG. 9B illustrates example voltage waveform timing diagrams of a memory device with a configuration in FIG. 9A, according to some implementations. However, FIG. 9B is not limited to the specific aspects depicted in those figures and other configurations may be used as will be understood by those skilled in the art.

A time period from time T1 to time T2 may be referred to as a pre-charging period. In some aspects, one or more bit lines, such as array common source (e.g., ACS 430), may be pre-charged. A time period from time T2 to time T3 may be referred to as a programming period. During the programming period, a voltage applied to a selected word line WLn can be ramped up from a low level (e.g., ground level) to a high level (e.g., a programming voltage Vpgm). A voltage applied to word lines WLn+1 to WLx can be ramped up from a low level (e.g., ground level) to a high level (e.g., a pass voltage Vpass1). A voltage applied to word lines WLn−1 to WL0 can be ramped up from a low level (e.g., ground level) to a high level (e.g., a pass voltage Vpass2). A voltage applied to word lines in first level 680 can be ramped up from a low level (e.g., ground level) to a high level (e.g., a pass voltage Vpass3+ΔV).

In some examples, a memory system can include a controller and a memory device coupled to the controller, as described with reference to FIGS. 1, 2A-2B, and 3-6. The memory system can be configured to perform operations as described with reference to FIGS. 7, 8A-8B, and 9A-9B.

As described above, lower level cells in a programmed state may suffer worse Vpass disturb, due to the erase and/or programming operation of the upper level cells. Among others, two advantages with the present disclosure can include: (1) Vpass disturb can be improved in the memory system by providing separate or different pass voltages when performing a programming operation on a memory cell in the first memory cells. For example, a first pass voltage can be applied to the first unselected word lines (e.g., WL 650, 652) and a second pass voltage can be applied to second word lines (e.g., WL 654, 656) corresponding to the second memory cells as described in FIGS. 7, 8A-8B, and 9A-9B; and (2) Vpass disturb can be further improved in the memory system by adjusting the second pass voltage based on a position of the selected word line (e.g., WL 640), thereby improving one or more performances of the memory system.

The foregoing description of the specific implementations will so fully reveal the general nature of the present disclosure that others can, by applying knowledge within the skill of the art, readily modify and/or adapt, for various applications, such specific implementations, without undue experimentation, and without departing from the general concept of the present disclosure. Therefore, such adaptations and modifications are intended to be within the meaning and range of equivalents of the disclosed implementations, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary implementations of the present disclosure as contemplated by the inventor(s), and thus, are not intended to limit the present disclosure and the appended claims in any way.

The breadth and scope of the present disclosure should not be limited by any of the above-described exemplary implementations, but should be defined only in accordance with the following claims and their equivalents.

What is claimed is:

1. A method for programming a memory device having a memory array, comprising blocks, wherein each block includes first memory cells and second memory cells, wherein the first memory cells and the second memory cells are connected in series to a bit line, the method comprising:

- performing a programming operation on a memory cell in the first memory cells,
- wherein the memory cell is controlled by a selected word line of first word lines corresponding to the first memory cells, wherein the first word lines comprises first unselected word lines of the first memory cells adjacent to the selected word line in a first direction, and
- wherein performing the programming operation comprises:
  - applying a programming voltage to the selected word line to program the memory cell into a target state;
  - applying a first pass voltage to the first unselected word lines;
  - applying a second pass voltage to second unselected word lines of the first memory cells adjacent to the selected word line in a second direction; and
  - applying a third pass voltage to second word lines corresponding to the second memory cells, wherein the second unselected word lines are adjacent to the second word lines, and wherein the third pass voltage is lower than the first pass voltage.

2. The method of claim 1, wherein performing the programming operation is subsequent to performing an erase operation on the first memory cells but not the second memory cells.

3. The method of claim 1, wherein a value of the third pass voltage is adjusted based on a position of the selected word line.

4. The method of claim 3, wherein the position of the selected word line is identifiable by a number of the second unselected word lines between the selected word line and the second word lines.

5. The method of claim 4, wherein the third pass voltage has a first value when a first number of the second unselected word lines are between the selected word line and the second word lines, wherein the third pass voltage has a second value different from the first value when a second number of the second unselected word lines are between the selected word line and the second word lines, and wherein the second number is different from the first number.

6. The method of claim 5, wherein the second number is smaller than the first number, and wherein the second value is greater than the first value.

7. The method of claim 1, wherein applying the programming voltage, applying the first pass voltage, applying the second pass voltage, and applying the third pass voltage are performed at substantially the same time.

8. A memory device, comprising:

- a memory array comprising blocks, wherein each block includes first memory cells and second memory cells, wherein the first memory cells and the second memory cells are connected in series to a bit line;
- a word line driver; and
- a controller configured to control the word line driver to:
  - performing a programming operation on a memory cell in the first memory cells,
    - wherein the memory cell is controlled by a selected word line of first word lines corresponding to the first memory cells, wherein the first word lines comprises first unselected word lines of the first memory cells adjacent to the selected word line in a first direction, and
    - wherein performing the programming operation comprises:
      - applying a programming voltage signal to the selected word line to program the memory cell into a target state;
      - applying a first pass voltage to the first unselected word lines;
      - applying a second pass voltage to second unselected word lines of the first memory cells adjacent to the selected word line in a second direction; and and
      - applying a third pass voltage to second word lines corresponding to the second memory cells, wherein the second unselected word lines are adjacent to the second word lines, and wherein the third pass voltage is lower than the first pass voltage.

9. The memory device of claim 8, wherein performing the programming operation is subsequent to performing an erase operation on the first memory cells but not the second memory cells.

10. The memory device of claim 8, wherein a value of the third pass voltage is adjusted based on a position of the selected word line.

11. The memory device of claim 10, wherein the position of the selected word line is identifiable by a number of the second unselected word lines between the selected word line and the second word lines.

12. The memory device of claim 11, wherein the third pass voltage has a first value when a first number of the second unselected word lines are between the selected word line and the second word lines, wherein the third pass voltage has a second value different from the first value when a second number of the second unselected word lines are between the selected word line and the second word lines, and wherein the second number is different from the first number.

13. The memory device of claim 12, wherein the second number is smaller than the first number, and wherein the second value is greater than the first value.

14. The memory device of claim 8, wherein applying the programming voltage, applying the first pass voltage, applying the second pass voltage, and applying the third pass voltage are performed at substantially the same time.

15. A memory system, comprising:

a controller; and a memory device coupled to the controller, the memory device comprising:

a memory array comprising blocks, wherein each block includes first memory cells and second memory cells, wherein the first memory cells and the second memory cells are connected in series to a bit line;

a word line driver; and a controller configured to control the word line driver to:

performing a programming operation on a memory cell in the first memory cells, wherein the memory cell is controlled by a selected word line of first word lines corresponding to the first memory cells, wherein the first word lines comprises first unselected word lines of the first memory cells adjacent to the selected word line in a first direction, and wherein performing the programming operation comprises:

applying a programming voltage signal to the selected word line to program the memory cell into a target state;

applying a first pass voltage to the first unselected word lines;

applying a second pass voltage to second unselected word lines of the first memory cells adjacent to the selected word line in a second direction; and applying a third pass voltage to second word lines corresponding to the second memory cells, wherein the second unselected word lines are adjacent to the second word lines, and wherein the third pass voltage is lower than the first pass voltage.

16. The memory system of claim 15, wherein performing the programming operation is subsequent to performing an erase operation on the first memory cells but not the second memory cells.

17. The memory system of claim 15, wherein a value of the third pass voltage is adjusted based on a position of the selected word line.

18. The memory system of claim 17, wherein the position of the selected word line is identifiable by a number of the second unselected word lines between the selected word line and the second word lines.

19. The memory system of claim 18, wherein the third pass voltage has a first value when a first number of the second unselected word lines are between the selected word line and the second word lines, wherein the third pass voltage has a second value different from the first value when a second number of the second unselected word lines are between the selected word line and the second word lines, and wherein the second number is different from the first number.

20. The memory system of claim 15, wherein applying the programming voltage, applying the first pass voltage, applying the second pass voltage, and applying the third pass voltage are performed at substantially the same time.

* * * * *